(12) United States Patent
Melanson et al.

(10) Patent No.: US 9,332,345 B1
(45) Date of Patent: May 3, 2016

(54) USE OF MICROPHONE CAPACITANCE AS A SWITCHED CAPACITOR IN AN INPUT NETWORK OF A DELTA-SIGMA MODULATOR

(71) Applicant: Cirrus Logic, Inc., Austin, TX (US)

(72) Inventors: John L. Melanson, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 43 days.

(21) Appl. No.: 14/248,035

(22) Filed: Apr. 8, 2014

Related U.S. Application Data

(60) Provisional application No. 61/810,075, filed on Apr. 9, 2013.

(51) Int. Cl.
*H04R 3/00* (2006.01)
*H03M 3/00* (2006.01)
*H04R 19/04* (2006.01)

(52) U.S. Cl.
CPC .................. *H04R 3/002* (2013.01); *H03M 3/00* (2013.01); *H03M 3/39* (2013.01); *H04R 3/00* (2013.01); *H03M 3/50* (2013.01); *H04R 19/04* (2013.01)

(58) Field of Classification Search
None
See application file for complete search history.

(56) References Cited

U.S. PATENT DOCUMENTS

| | | | |
|---|---|---|---|
| 4,631,749 A | 12/1986 | Rapaich | |
| 5,243,345 A | 9/1993 | Naus et al. | |
| 5,247,210 A | 9/1993 | Swanson | |
| 5,603,088 A | 2/1997 | Gorday et al. | |
| 6,566,942 B2 | 5/2003 | Shigenobu | |
| 6,724,332 B1 | 4/2004 | Melanson | |
| 6,738,004 B2 | 5/2004 | Melanson | |
| 6,809,572 B2 | 10/2004 | Yi et al. | |
| 6,822,594 B1 | 11/2004 | Melanson et al. | |
| 6,879,275 B1 | 4/2005 | Melanson | |
| 6,933,871 B2 | 8/2005 | Melanson et al. | |

(Continued)

FOREIGN PATENT DOCUMENTS

| | | |
|---|---|---|
| CN | 105264777 A | 1/2016 |
| EP | 0173983 A2 | 3/1986 |

(Continued)

OTHER PUBLICATIONS

Bloom, I. and Nemirovsky, Y.; 1/f Noise Reduction of Metal-Oxide-Semiconductor Transistors by Cycling from Inversion to Accumulation, Appl. Phys. Lett. 48 (15), Apr. 15, 1991, American Institute of Physics, pp. 1164-1666.

(Continued)

*Primary Examiner* — Andrew L Sniezek
(74) *Attorney, Agent, or Firm* — Jackson Walker L.L.P.

(57) ABSTRACT

In accordance with embodiments of the present disclosure, a method and apparatus for providing a digitized microphone signal to a digital processing device may include an analog signal path portion, a digital signal path portion, and a control circuit. The analog signal path portion may have an audio input configured to receive an analog input signal indicative of audio sounds incident upon an audio transducer. The digital signal path portion may have an analog-to-digital converter for converting the analog microphone signal to the digitized microphone signal. The control circuit may be configured to control a magnitude of the analog input signal or a derivative thereof in order to reduce audio distortion occurring in either or both of the analog signal path portion and the digital signal path portion.

38 Claims, 4 Drawing Sheets

(56) References Cited

U.S. PATENT DOCUMENTS

| | | | |
|---|---|---|---|
| 6,956,919 | B2 | 10/2005 | Amar et al. |
| 7,081,843 | B2 | 7/2006 | Melanson |
| 7,084,798 | B2 | 8/2006 | Melanson |
| 7,110,460 | B1 | 9/2006 | Melanson et al. |
| 7,116,721 | B1 | 10/2006 | Melanson et al. |
| 7,138,934 | B2 | 11/2006 | Melanson |
| 7,148,830 | B2 | 12/2006 | Melanson |
| 7,164,379 | B1 | 1/2007 | Rao |
| 7,170,434 | B2 | 1/2007 | Melanson |
| 7,183,957 | B1 | 2/2007 | Melanson |
| 7,187,312 | B2 | 3/2007 | Melanson |
| 7,190,294 | B2 | 3/2007 | Melanson |
| 7,196,647 | B2 | 3/2007 | Melanson |
| 7,205,917 | B2 | 4/2007 | Magrath |
| 7,298,305 | B2 | 11/2007 | Melanson |
| 7,358,881 | B2 | 4/2008 | Melanson |
| 8,890,051 | B2 | 11/2014 | Funakoshi |
| 8,907,829 | B1 * | 12/2014 | Naderi ............... 341/143 |
| 9,076,654 | B2 | 7/2015 | Zanchi |
| 2009/0278721 | A1 | 11/2009 | Hamashita |
| 2009/0295615 | A1 | 12/2009 | Steiner |
| 2010/0057474 | A1 | 3/2010 | Kong |
| 2011/0112668 | A1 | 5/2011 | Sorensen et al. |
| 2011/0150260 | A1 | 6/2011 | Miles |
| 2012/0224722 | A1 | 9/2012 | Nystrom |
| 2013/0051582 | A1 | 2/2013 | Kropfitsch et al. |
| 2013/0058495 | A1 | 3/2013 | Furst |
| 2013/0108074 | A1 | 5/2013 | Reining |
| 2013/0271307 | A1 | 10/2013 | Kropfitsch et al. |
| 2013/0335131 | A1 * | 12/2013 | Ceballos et al. ........... 327/337 |
| 2014/0140538 | A1 | 5/2014 | Kropfitsch et al. |
| 2014/0301571 | A1 | 10/2014 | Melanson et al. |
| 2014/0301572 | A1 | 10/2014 | Melanson et al. |
| 2014/0323844 | A1 | 10/2014 | Deliwala |
| 2014/0341397 | A1 | 11/2014 | Straeussnigg et al. |
| 2015/0086043 | A1 | 3/2015 | Sridharan et al. |
| 2015/0380005 | A1 | 12/2015 | Chesney |

FOREIGN PATENT DOCUMENTS

| | | |
|---|---|---|
| EP | 2421281 A2 | 2/2012 |
| EP | 2984759 A2 | 2/2016 |
| EP | 2984760 A2 | 2/2016 |
| GB | 2459862 A | 11/2009 |
| GB | 2459864 A | 11/2009 |
| GB | 2508612 A | 6/2014 |
| GB | 2513406 A | 10/2014 |
| WO | 2013182901 A1 | 12/2013 |
| WO | 2014168934 A2 | 10/2014 |
| WO | 2014168939 A2 | 10/2014 |
| WO | 2014174283 A1 | 10/2014 |
| WO | 2015200267 A2 | 12/2015 |

OTHER PUBLICATIONS

Koh, Jeongwook; Low-Frequency-Noise Reduction Technique for Linear Analog CMOS IC's, Dissertation, Lehrstuhl fur Technische Elektroniks der Technischen Universitat Munchen; 2005, 113 pages.

Kolhatkar, J.S., Salm, C., Knitel, M.J., and Wallinga, H.; Constant and Switched Bias Low Frequency Noise in p-MOSFETs with Varying Gate Oxide Thickness ESSDERC 2002, pp. 83-86.

Ersoy, Selcuk, Van Veldhoven, Robert H.M., Sebastiano, Fabio, Reimann, Klaus, Makinwa, Kofi A.A.; A 0.25mm2 AC-Biased MEMS Microphone Interface with 28dBA SNR, ISSCC 2013 / Session 22 / Sensors & Displays / 22.2, 2013 IEEE International Solid-State Circuits Conference, Digest of Technical Papers, Feb. 20, 2013, pp. 382-383.

International Search Report and Written Opinion, International Application No. PCT/GB2014/051262, Sep. 22, 2014, 18 pages.

Search Report under Section 17, GB Patent Application No. GB1307576.7, Oct. 9, 2013, 3 pages.

Zhou, et al., Precompensated excitation waveforms to suppress harmonic generation in MEMS electrostatic transducers, IEEE Transactions on Ultrasonics, Ferroelectrics and Frequency Control, vol. 51, Issue 11, Nov. 2004, pp. 1564-1574.

Jawed, Syed Arsalan, CMOS Readout Interfaces for MEMS Capacitive Microphones, Mar. 31, 2009, Retrieved from the Internet: http://eprints-phd.biblio.unitn.it/82/1/thesis_mems_microphone_readout.pdf.

O'Neal, J.B., Delta Modulation Quantizing Noise Analytical and Computer Simulation Results for Gaussian and Television Input Signals, Bell Systems Technical Journal, Jan. 1966, pp. 117-141.

International Search Report and Written Opinion, International Application No. PCT/US2014/033314, Nov. 7, 2014, 17 pages.

International Search Report and Written Opinion, International Application No. PCT/US2014/033302, Nov. 7, 2014, 10 pages.

International Search Report and Written Opinion, International Application No. PCT/US2015/037101, mailed Jan. 4, 2016, 20 pages.

Anonymous: Data compression—Wikipedia, the free encyclopedia, Jun. 17, 2014, Retrieved from the Internet: https://en.wikipedia.org/w/index.php?title=Data_compression&oldid=613257125 [retrieved on Oct. 5, 2015], pp. 1-3, 7-9.

Anonymous: Lossless compression—Wikipedia, the free encyclopedia, Jun. 18, 2014, Retrieved from the Internet: https://en.wikipedia.org/w/index.php?title=Lossless_compression&oldid=613463592 [retrieved on Oct. 5, 2015], pp. 2-3, 5-6.

Abadi et al., Integrating compression and execution in column-oriented database systems, ACM Proceedings of SIGMOD. International Conference on Management of Data, Jun. 27, 2006, pp. 671-682.

Combined Search and Examination Report under Sections 17 and 18(3), Application No. GB1511091.9, mailed Jan. 21, 2016, 8 pages.

* cited by examiner

USE OF MICROPHONE CAPACITANCE AS A SWITCHED CAPACITOR IN AN INPUT NETWORK OF A DELTA-SIGMA MODULATOR

RELATED APPLICATIONS

The present disclosure claims priority to U.S. Provisional Patent Application Ser. No. 61/810,075, filed Apr. 9, 2013, which is incorporated by reference herein in its entirety.

FIELD OF DISCLOSURE

The present disclosure relates in general to audio systems, and more particularly, to reducing distortion of a microphone signal.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone. To process audio signals generated by a microphone, microphones are often coupled to an audio system. However, many traditional audio system topologies may have disadvantages, as is illustrated with reference to FIG. 1.

FIG. 1 illustrates a block diagram of selected components of an example audio system 100, as is known in the art. As shown in FIG. 1, audio system 100 may include an analog signal path portion comprising bias voltage source 102, a microphone transducer 104, analog pre-amplifier 108, a digital path portion comprising an analog-to-digital converter (ADC) 110, a driver 112, and a digital audio processor 114.

Bias voltage source 102 may comprise any suitable system, device, or apparatus configured to supply microphone transducer 104 with a direct-current bias voltage $V_{BIAS}$, such that microphone transducer 104 may generate an electrical audio signal. Microphone transducer 104 may comprise any suitable system, device, or apparatus configured to convert sound incident at microphone transducer 104 to an electrical signal, wherein such sound is converted to an electrical analog input signal using a diaphragm or membrane having an electrical capacitance (modeled as variable capacitor 106 in FIG. 1) that varies as based on sonic vibrations received at the diaphragm or membrane. Microphone transducer 104 may include an electrostatic microphone, a condenser microphone, an electret microphone, a microelectromechanical systems (MEMs) microphone, or any other suitable capacitive microphone. Pre-amplifier 108 may receive the analog input signal output from microphone transducer 104 and may comprise any suitable system, device, or apparatus configured to condition the analog audio signal for processing by ADC 110.

ADC 110 may receive a pre-amplified analog audio signal output from pre-amplifier 108, and may comprise any suitable system device or apparatus configured to convert the pre-amplified analog audio signal received at its input to a digital signal representative of the analog audio signal generated by microphone transducer 104. ADC 110 may itself include one or more components (e.g., delta-sigma modulator, decimator, etc.) for carrying out the functionality of ADC 110. Driver 112 may receive the digital signal output by ADC 110 and may comprise any suitable system, device, or apparatus configured to condition such digital signal (e.g., encoding into Audio Engineering Society/European Broadcasting Union (AES/EBU), Sony/Philips Digital Interface Format (S/PDIF), or other suitable audio interface standards), in the process generating a digitized microphone signal for transmission over a bus to digital audio processor 114.

Once converted to the digitized microphone signal, the digitized microphone signal may be transmitted over significantly longer distances without being susceptible to noise as compared to an analog transmission over the same distance. In some embodiments, one or more of bias voltage source 102, pre-amplifier 108, ADC 110, and driver 112 may be disposed in close proximity with microphone transducer 104 to ensure that the length of the analog signal transmission lines are relatively short to minimize the amount of noise that can be picked up on such analog output lines carrying analog signals. For example, in some embodiments, one or more of bias voltage source 102, microphone transducer 104, pre-amplifier 108, ADC 110, and driver 112 may be formed on the same integrated circuit die or substrate.

Digital audio processor 114 may comprise any suitable system, device, or apparatus configured to process the digitized microphone signal for use in a digital audio system. For example, digital audio processor 114 may comprise a microprocessor, microcontroller, digital signal processor (DSP), application specific integrated circuit (ASIC), or any other device configured to interpret and/or execute program instructions and/or process data, such as the digitized microphone signal output by driver 112.

Despite the various advantages of digital microphone systems such as those shown in FIG. 1, such digital microphone systems may have disadvantages. For example, many components of the analog path portion, and in particular pre-amplifier 108, may be susceptible to noise and may consume significant amounts of power during operation.

SUMMARY

In accordance with the teachings of the present disclosure, certain disadvantages and problems associated with existing audio systems including microphones may be reduced or eliminated.

In accordance with embodiments of the present disclosure, an input network for a delta-sigma modulator having a feedback digital-to-analog stage and at least one integrator stage including an input integrator stage may include a plurality of sampling capacitors. At least one of the plurality of sampling capacitors may include a microphone capacitance of a microphone transducer, wherein the microphone capacitance may be variable and indicative of audio sounds incident upon the microphone transducer. During a first phase of a clock signal, the one or more sampling capacitors may sample an input signal wherein the input signal is a function of the microphone capacitance. During a second phase of the clock signal, the input network may charge transfer the input signal onto an input of the input integrator stage.

In accordance with these and other embodiments of the present disclosure, a method may include, during a first period of a first phase of a clock signal, sampling an input signal with one or more sampling capacitors of input network for a delta-sigma modulator having a feedback digital-to-analog stage, at least one integrator stage including an input integrator stage, and a plurality of sampling capacitors. At least one of the plurality of sampling capacitors may comprise a microphone capacitance of a microphone transducer, wherein the microphone capacitance is variable and indicative of audio sounds incident upon the microphone transducer, and further wherein the input signal is a function of the microphone capacitance. The method may also include transferring the input signal onto an input of the input integrator stage during a second phase of the clock signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
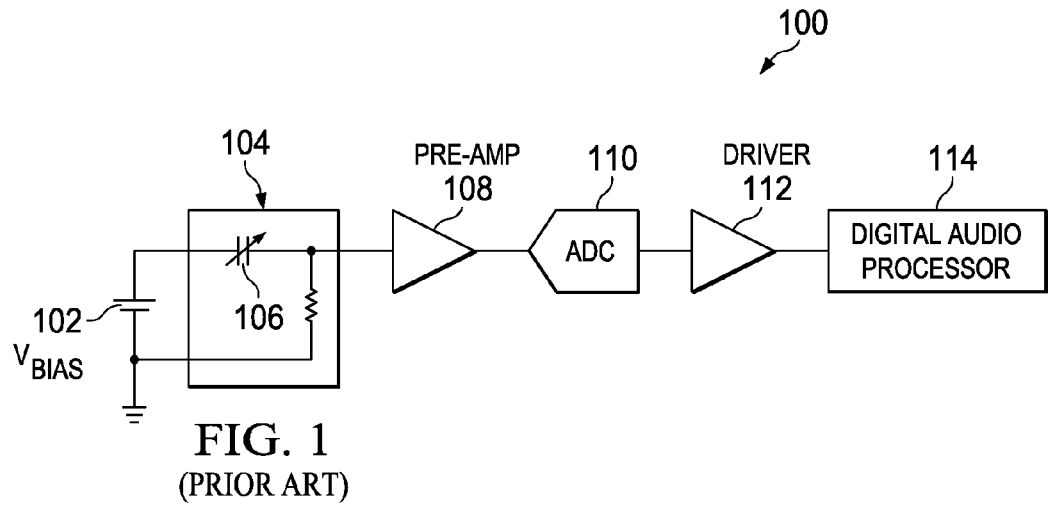
FIG. 1 illustrates a block diagram of selected components of an example audio system, as is known in the art.
Figure 2:
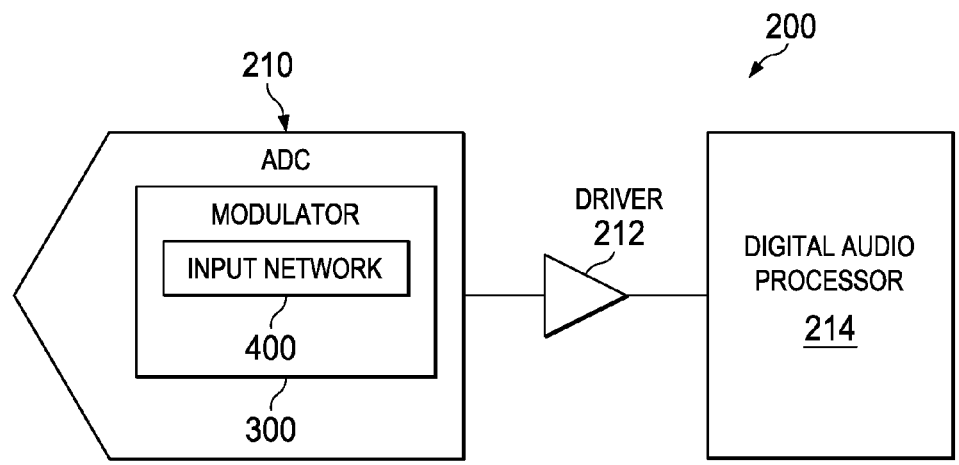
FIG. 2 illustrates a block diagram of selected components of an example audio system, in accordance with embodiments of the present disclosure.

FIG. 2 illustrates a block diagram of selected components of an example audio system 200, in accordance with embodiments of the present disclosure. As shown in FIG. 2, audio system 200 may include an analog-to-digital converter (ADC) 210, a driver 212, and a digital audio processor 214.

As shown in FIG. 2, ADC 210 may include an input network 400 and a modulator 300. As described in greater detail below, input network 400 may include a switched capacitor network wherein at least one switched capacitor of the switched capacitor network comprises a microphone capacitance of a microphone transducer. Such microphone capacitance may be variable based on sounds incident upon the microphone transducer, and accordingly, such microphone transducer may generate an analog signal which may then be converted into the digital domain by remaining components of ADC 210, including modulator 300. Driver 212 may receive the digital signal output by ADC 210 and may comprise any suitable system, device, or apparatus configured to condition such digital signal (e.g., encoding into AES/EBU, S/PDIF, or other suitable audio interface standards), in the process generating a digitized microphone signal for transmission over a bus to digital audio processor 214. Digital audio processor 214 may comprise any suitable system, device, or apparatus configured to process the digitized microphone signal for use in a digital audio system. For example, digital audio processor 214 may comprise a microprocessor, microcontroller, digital signal processor (DSP), application specific integrated circuit (ASIC), or any other device configured to interpret and/or execute program instructions and/or process data, such as the digitized microphone signal output by driver 212.

Figure 3:
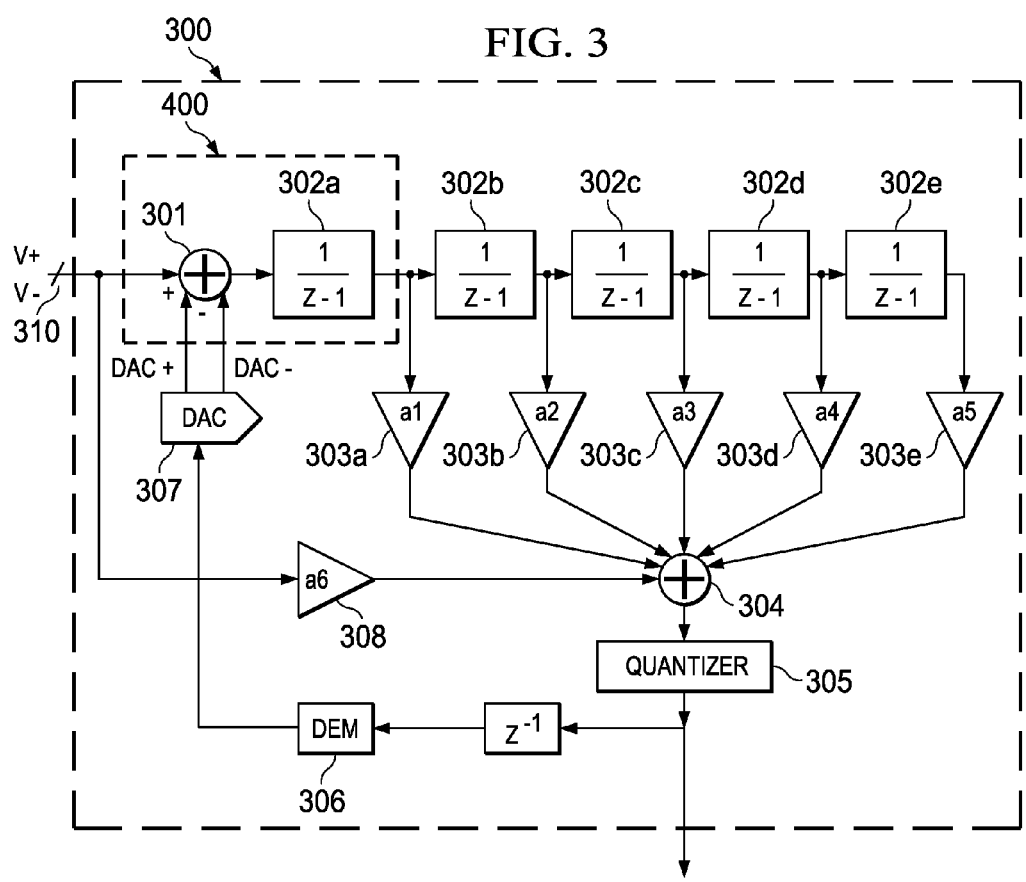
FIG. 3 illustrates a block diagram of an example delta-sigma feedforward modulator, in accordance with embodiments of the present disclosure.

FIG. 3 illustrates a block diagram of an example delta-sigma feed-forward modulator 300, in accordance with embodiments of the present disclosure. Modulator 300 may be a suitable modulator that may be used as or as part of ADC 210 depicted in FIG. 2. Delta-sigma modulator 300 may include an input summer 301 and one or more integrator stages 302. Although any suitable number of integrator stages may be used, in the embodiments represented by FIG. 3, delta-sigma modulator 300 includes five integrator stages 302a-302e, and thus delta-sigma modulator 300 depicted in FIG. 3 is a fifth-order delta-sigma modulator. Delta-sigma modulator 300 may include a weighted feed-forward design in which the outputs of each of the integrator stages may be passed through a respective gain stage (amplifier) 303 (e.g., amplifiers 303a-303e) to an output summer 304. Amplifiers 303a-303e may allow the outputs of the integrator stages to be weighted at the input of summer 304. The output from summer 304 may be quantized by a multiple-bit quantizer 305, which may generate a multiple-bit digital output signal labeled as ADC in FIG. 3. Additionally, the output from quantizer 305 may be fed back to the inverting input of summer 301 through dynamic element matching (DEM) circuitry 306 and digital-to-analog converter (DAC) 307.

FIG. 3 also depicts an additional feed-forward path, including amplifier 308, between modulator input 310 and summer 304. The gain of amplifier stage 308 may be given by the equation gain=(1/Quantizer gain)(1/DAC gain), where "Quantizer gain" is a signal gain applied by quantizer 305 and "DAC gain" is a signal gain applied by DAC 307. The purpose of this additional feed-forward path is to cancel as much of the input signal energy from the delta-sigma loop as possible. Consequently, most of the voltage swing within the modulator may be quantization noise. In turn, the design constraints on the sub-circuits within modulator 300 may be relaxed. For example, the first integrator stage 302a is typically the major contributor to the noise performance of the entire modulator. This feed-forward technique results in less signal energy at the outputs of the integrator stages, and hence such parameters as the stage operation amplifier (opamp) DC gain may be reduced. In turn, the power consumption of the device as well as the die size may be reduced.

A fifth-order feed-forward design was selected for discussion purposes; in actual implementation, the order as well as the configuration of modulator 300 may vary.

Figure 4A:
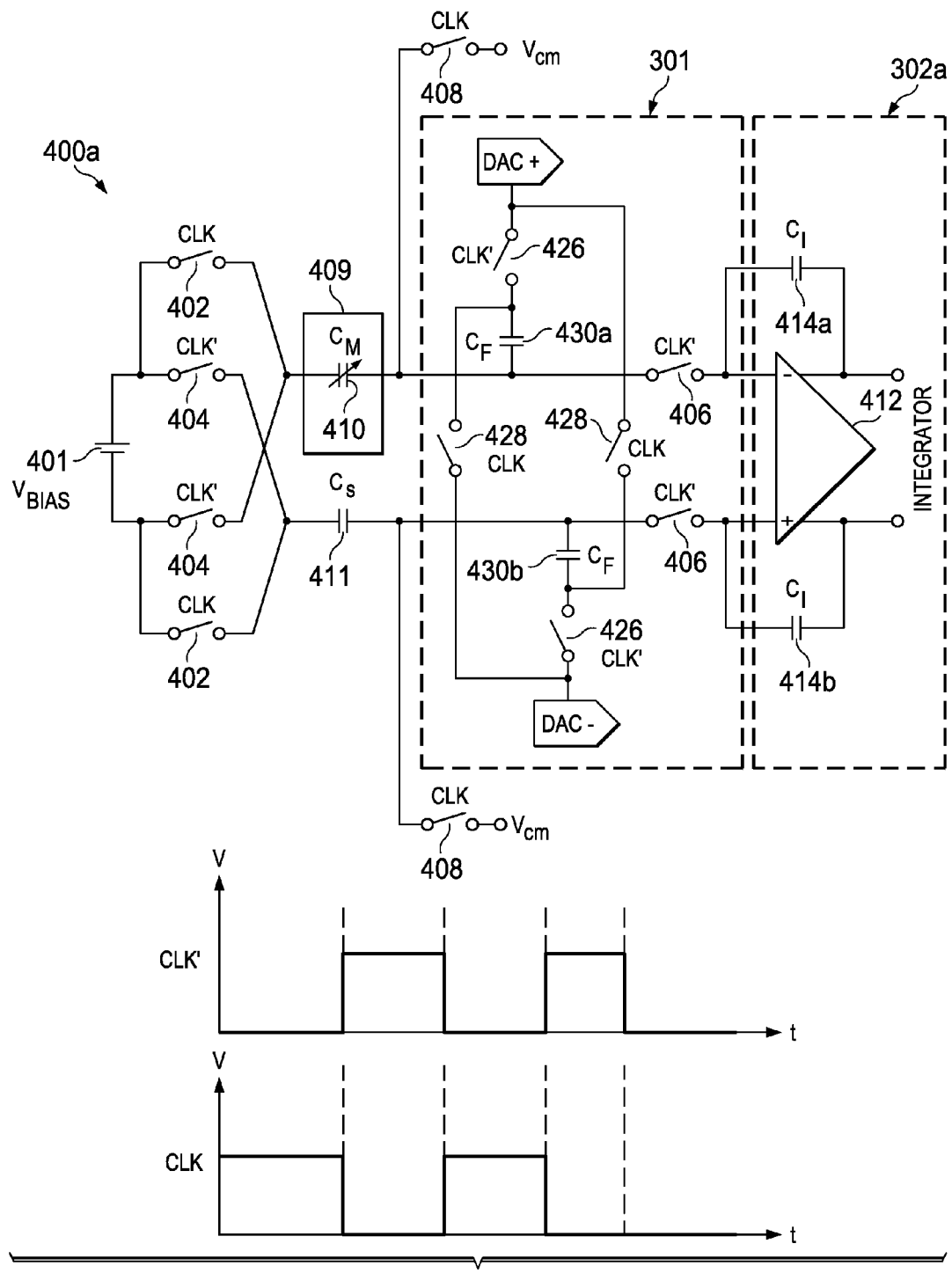
FIG. 4A illustrates a block diagram of an input sampling network for a delta-sigma modulator, in accordance with embodiments of the present disclosure.

FIG. 4A illustrates a block diagram of an input sampling network 400a, in accordance with embodiments of the present disclosure. In some embodiments, input sampling network 400a may be utilized as input summer 301 and first stage 302a of delta-sigma modulator 300 of FIG. 3, although its utility is not limited thereto.

Input network 400a may include sampling capacitors 410 and 411. As depicted in FIG. 4A, a capacitance of sampling capacitor 410 may be variable. Such variable capacitance $C_M$ may be a microphone capacitance of a microphone transducer 409, wherein the microphone capacitance is indicative of audio sounds incident upon microphone transducer 409. Microphone transducer 409 may comprise any suitable system, device, or apparatus configured to convert sound incident at microphone transducer 409 to an electrical signal, wherein such sound is converted to an electrical analog input signal using a diaphragm or membrane having an electrical capacitance (e.g., sampling capacitor 410 in FIGS. 4A and 4B) that varies as based on sonic vibrations received at the diaphragm or membrane. Microphone transducer 409 may include an electrostatic microphone, a condenser microphone, an electret microphone, a microelectromechanical systems (MEMs) microphone, or any other suitable capacitive microphone.

As shown in FIG. 4A, sampling capacitors 410 and 411 may be biased by a bias voltage source 401. Bias voltage source 401 may comprise any suitable system, device, or apparatus configured to supply sampling capacitors 410 and 411 a direct-current bias voltage $V_{BIAS}$, such that microphone transducer 409 may generate an electrical audio signal as its capacitance varies in response to incident audio sounds.

Input network 400a of FIG. 4A may generally operate in accordance with a clock signal CLK, the complement of which is a signal CLK'. Each of clock signals CLK and CLK' may comprise a square-wave signal, as shown in FIG. 4A. Clock signals CLK and CLK' may define clock cycles operating at a sampling rate wherein each clock cycle includes a first phase when clock signal CLK is high and clock signal CLK' is low and a second phase when clock signal CLK is low and clock signal CLK' is high. Generally, during the first phase of each cycle, switches 402 and 408 may close and a charge stored by sampling capacitor 410 as a result of the change in capacitance $C_M$ of sampling capacitor 410 in response to incident audio sounds may be sampled onto cross-coupled sampling capacitors 410 and 411 as a differential signal. During the second phase of each cycle, switches 404 and 406 may close, effectively changing the polarity of bias voltage source 401. Consequently the charges sampled onto sampling capacitors 410 and 411 during the first phase may be respectively charge transferred onto integration capacitors 414a and 414b which are each coupled between inputs and outputs of an integrator 412.

Feedback voltages DAC$^+$ and DAC$^-$ may also be applied to the feedback capacitors 430a and 430b during each phase via switches 426 and 428, thus performing sampling for the feedback voltage signals and the function of summer 301 in applying negative feedback of the DAC$^+$ and DAC$^-$ signals. In some embodiments, the relative sizes of the capacitances $C_F$ of feedback capacitors 430a and 430b and the capacitances $C_M$ and $C_S$ of sampling capacitors 410 and 411 may be selected to provide for a desired feedback gain.

Figure 4B:
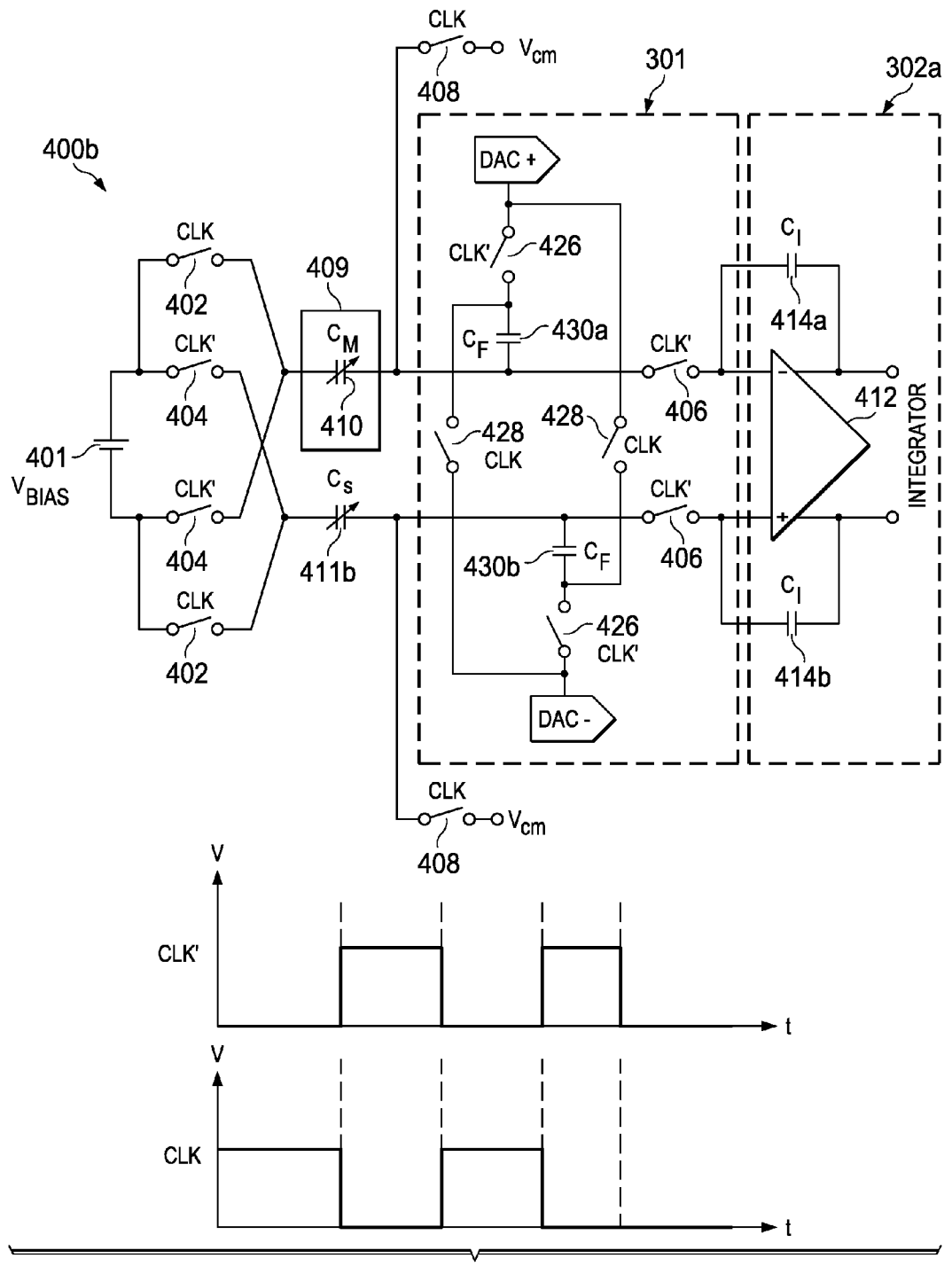
FIG. 4B illustrates a block diagram of another input sampling network for a delta-sigma modulator, in accordance with embodiments of the present disclosure.

FIG. 4B illustrates a block diagram of another input sampling network 400b, in accordance with embodiments of the present disclosure. In some embodiments, input sampling network 400b may be utilized as input summer 301 and first stage 302a of delta-sigma modulator 300 of FIG. 3, although its utility is not limited thereto. Sampling network 400b as depicted in FIG. 4B is identical to sampling network 400b depicted in FIG. 4A, except that fixed-capacitance capacitor 411 of input network 400 is replaced with variable-capacitance capacitor 411b. Accordingly, operation and functionality of input network 400b may be similar to that of input network 400a, except that the variable capacitance of capacitor 411b may allow for larger differential input signals than if such capacitance was fixed, which may improve performance characteristics (e.g., noise, signal integrity) of input network 400b.

For example, in some embodiments sampling capacitor 411b may comprise a second microphone capacitance of a second microphone transducer, wherein the second microphone capacitance varies as a function of audio sounds incident upon the second microphone transducer. In such embodiments, the second microphone transducer may be physically arranged with respect to microphone transducer 409 such that charge forming on sampling capacitors 410 and 411b is of substantially equal magnitude but with opposite polarity, thus potentially increasing the voltage swing of differential input signal as compared to embodiments in which sampling capacitor 411 is fixed.

As another example, in some embodiments, input network 400b may be configured (e.g., may comprise additional components than that depicted in FIG. 4B) such that the variable capacitance of sampling capacitor 411b is a function of the analog feedback signal (e.g., differential output signal represented by DAC+ and DAC−) generated by a feedback digital-to-analog stage of ADC 210.

In some embodiments of the present disclosure, an input network (e.g., input network 400a or input network 400b), including a microphone transducer integral thereto, may be formed along with other components of modulator 300 upon a single substrate. In other embodiments, one or more components of an input network (e.g., input network 400a or input network 400b), including a microphone transducer integral thereto, and other components of modulator 300 may be formed on different substrates packaged within the same integrated circuit package.

The methods and systems disclosed herein may provide one or more advantages over traditional approaches. For example, by integrating the capacitance of a microphone transducer into the input network of a delta-sigma modulator, a digital microphone system may not require a separate analog pre-amplifier (e.g., analog pre-amplifier 108), which may potentially reduce circuit size, reduce power consumption, and reduce noise present in an analog portion of a digital microphone system.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An input network for a delta-sigma modulator having a feedback digital-to-analog stage and at least one integrator stage including an input integrator stage, the input network comprising:
   a plurality of sampling capacitors, wherein at least one of the plurality of sampling capacitors comprises a microphone capacitance of a microphone transducer, and further wherein the microphone capacitance is variable and indicative of audio sounds incident upon the microphone transducer; and wherein:

during a first phase of a clock signal, the one or more sampling capacitors sample an input signal wherein the input signal is a function of the microphone capacitance; and during a second phase of the clock signal, the input network charge transfers the input signal onto an input of the input integrator stage.

2. The input network of claim 1, wherein one of the plurality of sampling capacitors other than the microphone capacitance comprises a fixed capacitor.

3. The input network of claim 1, wherein one of the plurality of sampling capacitors other than the microphone capacitance comprises a variable capacitor.

4. The input network of claim 3, wherein the feedback digital-to-analog stage is configured to generate an analog feedback signal, and wherein a capacitance of the variable capacitor is a function of the analog feedback signal.

5. The input network of claim 3, wherein the variable capacitor comprises second microphone capacitance of a second microphone transducer, and wherein the second microphone capacitance is indicative of audio sounds incident upon the second microphone transducer.

6. The input network of claim 5, wherein the microphone transducer and the second microphone transducer each comprises a microelectromechanical systems microphone.

7. The input network of claim 3, wherein the input network and the delta-sigma modulator are formed on a single substrate.

8. The input network of claim 3, wherein the input network and the delta-sigma modulator are formed on different substrates packaged within the same integrated circuit package.

9. The input network of claim 1, wherein the microphone transducer and the at least one integrator stage are formed on a single substrate.

10. The input network of claim 1, wherein the microphone transducer and the at least one integrator stage are formed on different substrates packaged within the same integrated circuit package.

11. The input network of claim 1, wherein the microphone transducer comprises a microelectromechanical systems microphone.

12. The input network of claim 1, wherein the input signal is represented by a magnitude of electrical charge stored by the microphone capacitance.

13. The input network of claim 1, wherein the input signal is a differential signal.

14. The input network of claim 1, wherein the input of the input integrator stage is a differential input.

15. A method comprising:
during a first period of a first phase of a clock signal, sampling an input signal with one or more sampling capacitors of input network for a delta-sigma modulator having a feedback digital-to-analog stage, at least one integrator stage including an input integrator stage, and a plurality of sampling capacitors, wherein:
at least one of the plurality of sampling capacitors comprises a microphone capacitance of a microphone transducer;
the microphone capacitance is variable and indicative of audio sounds incident upon the microphone transducer; and
the input signal is a function of the microphone capacitance; and
during a second phase of the clock signal, transferring the input signal onto an input of the input integrator stage.

16. The method of claim 15, wherein one of the plurality of sampling capacitors other than the microphone capacitance comprises a fixed capacitor.

17. The method of claim 15, wherein one of the plurality of sampling capacitors other than the microphone capacitance comprises a variable capacitor.

18. The method of claim 17, further comprising varying the capacitance of the variable capacitor as function of an analog feedback signal generated by the feedback digital-to-analog stage.

19. The method of claim 17, wherein the variable capacitor comprises second microphone capacitance of a second microphone transducer, and wherein the second microphone capacitance is indicative of audio sounds incident upon the second microphone transducer.

20. The method of claim 19, wherein the microphone transducer and the second microphone transducer each comprises a microelectromechanical systems microphone.

21. The method of claim 17, wherein the input network and the delta-sigma modulator are formed on a single substrate.

22. The method of claim 17, wherein the input network and the delta-sigma modulator are formed on different substrates packaged within the same integrated circuit package.

23. The method of claim 15, wherein the microphone transducer and the delta-sigma modulator are formed on a single substrate.

24. The method of claim 15, wherein the microphone transducer and the at least one integrator stage are formed on different substrates packaged within the same integrated circuit package.

25. The method of claim 15, wherein the microphone transducer comprises a microelectromechanical systems microphone.

26. The method of claim 15, wherein the input signal is represented by a magnitude of electrical charge stored by the microphone capacitance.

27. The method of claim 15, wherein the input signal is a differential signal.

28. The method of claim 15, wherein the input of the input integrator stage is a differential input.

29. An integrated circuit comprising:
a delta-sigma modulator comprising:
at least one integrator stage including an input integrator stage;
an input network for the input integrator stage comprising a plurality of sampling capacitors, wherein at least one of the plurality of sampling capacitors comprises a microphone capacitance of a microphone transducer, and further wherein the microphone capacitance is variable and indicative of audio sounds incident upon the microphone transducer; and wherein:
during a first phase of a clock signal, the one or more sampling capacitors sample an input signal wherein the input signal is a function of the microphone capacitance; and
during a second phase of the clock signal, the input network charge transfers the input signal onto an input of the input integrator stage;
an output for generating an output signal based on the input signal; and
a digital data driver for communicating the output signal over a bus.

30. The integrated circuit of claim 29, wherein one of the plurality of sampling capacitors other than the microphone capacitance comprises a fixed capacitor.

31. The integrated circuit of claim 29, wherein one of the plurality of sampling capacitors other than the microphone capacitance comprises a variable capacitor.

32. The integrated circuit of claim 31, wherein the feedback digital-to-analog stage is configured to generate an analog feedback signal, and wherein a capacitance of the variable capacitor is a function of the analog feedback signal.

33. The integrated circuit of claim 31, wherein the variable capacitor comprises second microphone capacitance of a second microphone transducer, and wherein the second microphone capacitance is indicative of audio sounds incident upon the second microphone transducer.

34. The integrated circuit of claim 31, wherein the microphone transducer and the second microphone transducer each comprises a microelectromechanical systems microphone.

35. The integrated circuit of claim 29, wherein the microphone transducer comprises a microelectromechanical systems microphone.

36. The integrated circuit of claim 29, wherein the input signal is represented by a magnitude of electrical charge stored by the microphone capacitance.

37. The integrated circuit of claim 29, wherein the input signal is a differential signal.

38. The integrated circuit of claim 29, wherein the input of the input integrator stage is a differential input.

* * * * *